(12) United States Patent
Iler

(10) Patent No.: US 7,738,552 B2
(45) Date of Patent: Jun. 15, 2010

(54) PROCESSING DATA STREAMS

(75) Inventor: John Iler, Burlington, MA (US)

(73) Assignee: Broadcom Company, Irvine, CA (US)

( * ) Notice: Subject to any disclaimer, the term of this patent is extended or adjusted under 35 U.S.C. 154(b) by 1052 days.

(21) Appl. No.: 10/730,405

(22) Filed: Dec. 8, 2003

(65) Prior Publication Data

US 2004/0114682 A1 Jun. 17, 2004

Related U.S. Application Data

(60) Provisional application No. 60/431,407, filed on Dec. 6, 2002.

(51) Int. Cl.
*H04N 7/12* (2006.01)

(52) U.S. Cl. ............... 375/240.01; 375/240; 375/240.12

(58) Field of Classification Search ................ 375/240, 375/240.01, 240.12; 370/474; 382/239
See application file for complete search history.

(56) References Cited

U.S. PATENT DOCUMENTS

| | | | |
|---|---|---|---|
| 6,404,932 B1 * | 6/2002 | Hata et al. | 382/239 |
| 6,414,991 B1 * | 7/2002 | Yagasaki et al. | 375/240.12 |
| 7,061,936 B2 * | 6/2006 | Yoshimura et al. | 370/474 |

* cited by examiner

*Primary Examiner*—Allen Wong
(74) *Attorney, Agent, or Firm*—McAndews Held & Malloy, Ltd.

(57) ABSTRACT

Streams of data are processed. A stream of data including a plurality of encoded symbols is received. Symbols from a first subset of the encoded symbols are processed contemporaneously to determine a second subset of encoded symbols, each of which uses a common coding context. At least one symbol from the second subset is evaluated to determine the common coding context. The common coding context is used to process the second subset of encoded symbols.

16 Claims, 3 Drawing Sheets

FIG. 1 - Prior Art

PROCESSING DATA STREAMS

CROSS REFERENCE TO RELATED APPLICATIONS

The present application claims the benefit of and priority to U.S. provisional application Ser. No. 60/431,407, filed Dec. 6, 2002, entitled "Arithmetic Coding and Bandwidth Enhancement for Digital Video Disc Applications," the entire disclosure of which is herein incorporated by reference.

TECHNICAL FIELD

The invention relates to processing data streams. In particular, one embodiment of the invention relates to decoding multiple encoded symbols from a stream of video data in one clock cycle.

BACKGROUND OF THE INVENTION

Arithmetic coding is an entropy coding scheme that addresses certain shortcomings of other current encoding methods, such as Huffman coding. For example, current methods require an integral number of bits for each element of data to be encoded. However, elements with nonintegral entropy require a nonintegral number of bits in the code stream to achieve optimal compression. In addition, the probabilities for each element to be encoded can vary based on a coding context (e.g., the contents of neighboring elements or recently processed elements). One method of addressing the varying probabilities employs a coding table for each context to properly model the conditional probability. However, as the number of contexts rises, the inefficiencies also increase.

Furthermore, the probabilities for each element may vary significantly over time and thus require adaptive, dynamic modifications, which can be expensive in terms of time and/or hardware resources. However, while providing improved results on matching the entropy of the input stream and addressing the issued outlined above, arithmetic coding introduces other implementation difficulties.

Most straightforward implementations of arithmetic coding (particularly those implemented in hardware) require that all of the elements to be coded be binary elements. This generally requires that the potentially multi-bit symbol be 'binarized' to a stream of binary digits (bits) (or 'bins' in the parlance of the H.264 standard). Furthermore, most hardware implementations code only one bit per clock cycle, and in some cases fewer when multi-bit re-normalization is required.

For some coding standards, the worst case (highest) number of bits being supplied to an arithmetic encoder or out of a corresponding arithmetic decoder can be quite large. For example, an apparatus using the H.264 standard for processing video data and running at a clock rate of 200 MHz, may be required to process 10-20 bits per clock cycle to keep up with real time requirements in the worst case. However, typical implementations handle, at best, one bit per clock cycle.

SUMMARY OF THE INVENTION

In general, the invention relates to processing data streams. Aspects of the invention related to methods of encoding and decoding streams of video data in a manner that can support increased output requirements.

In at least one aspect, the invention relates to a method of processing a stream of data. The method includes receiving a stream of data that includes a plurality of encoded symbols, contemporaneously processing a first subset of the encoded symbols to identify a second subset of the encoded symbols such that each symbol in the subset uses a common coding context, evaluating at least one symbol from the second subset to determine the common coding context, and using the common coding context to process the second subset of encoded symbols.

In at least some embodiments, the processing of the second subset of symbols includes decoding the encoded data stream, which in some embodiments includes encoded video data. The encoded symbols can represent elements of the encoded video data, and can be encoded in a manner consistent with the H.264 standard encoding scheme, or in some embodiments with the MPEG-4 part 10 standard encoding scheme.

In another aspect, the invention relates to a method of processing a stream of data. The method includes receiving a stream of data that includes a plurality of symbols to be processed, contemporaneously processing a first subset of the symbols to identify a second subset of the symbols, where each symbol in the second subset uses a common coding context, evaluating at least one symbol from the second subset to determine the common context, and using the common coding context to process the second subset of symbols.

In at least some embodiments, the processing of the second subset includes encoding the stream of data, which in some embodiments includes video data. The symbols can represent elements of the video data, and can be encoded in a manner consistent with the H.264 standard encoding scheme, or in some embodiments with the MPEG-4 part 10 standard encoding scheme.

While particularly useful in the field of video data, these methods are not limited to that specific application, and can be used in similar applications where data streams are encoded or decoded.

BRIEF DESCRIPTION OF THE DRAWINGS

In the drawings, like reference characters generally refer to the same elements throughout the different views. In addition, the drawings are not necessarily to scale, emphasis instead generally being placed upon illustrating the principles of the invention.

DETAILED DESCRIPTION

Implementations of this invention meet the worst case real time coding requirements presented by the real time nature of video. As noted above, typical implementations may handle, at best, one bit per clock cycle. In accordance with the invention, multi-bit coding per cycle techniques are applied to process video data using H.264 and similar standards for encoding and decoding video data. The term H.264 represents the ITU standard H.264, which is similar to the MPEG-4 part 10 standard (also known as the Advanced Video Coding standard) from the International Standards Organization. The H.264 standard represents one possible coding scheme to which this invention can be applied, however any video coding scheme where the acceleration of the coding process is desired can benefit from the techniques described below. One embodiment of the invention is applicable to hardware applications, but it could also be applied to software applications.

Implementations of the invention take advantage of three characteristics of the data streams being processed. Standards such as H.264 define a maximum code stream data rate, and therefore the number of elements with poor compression rates (i.e., the probabilities of each potential symbol are near ½) are limited. Further, the coding context used to determine the conditional probability for the bit to be coded is often the same for many bits of data in a row, thus allowing the context of one element to be used for the coding of multiple subsequent elements. Third, the long runs of identical coding contexts are often associated with long runs of a most probable symbol ("MPS").

Figure 1:
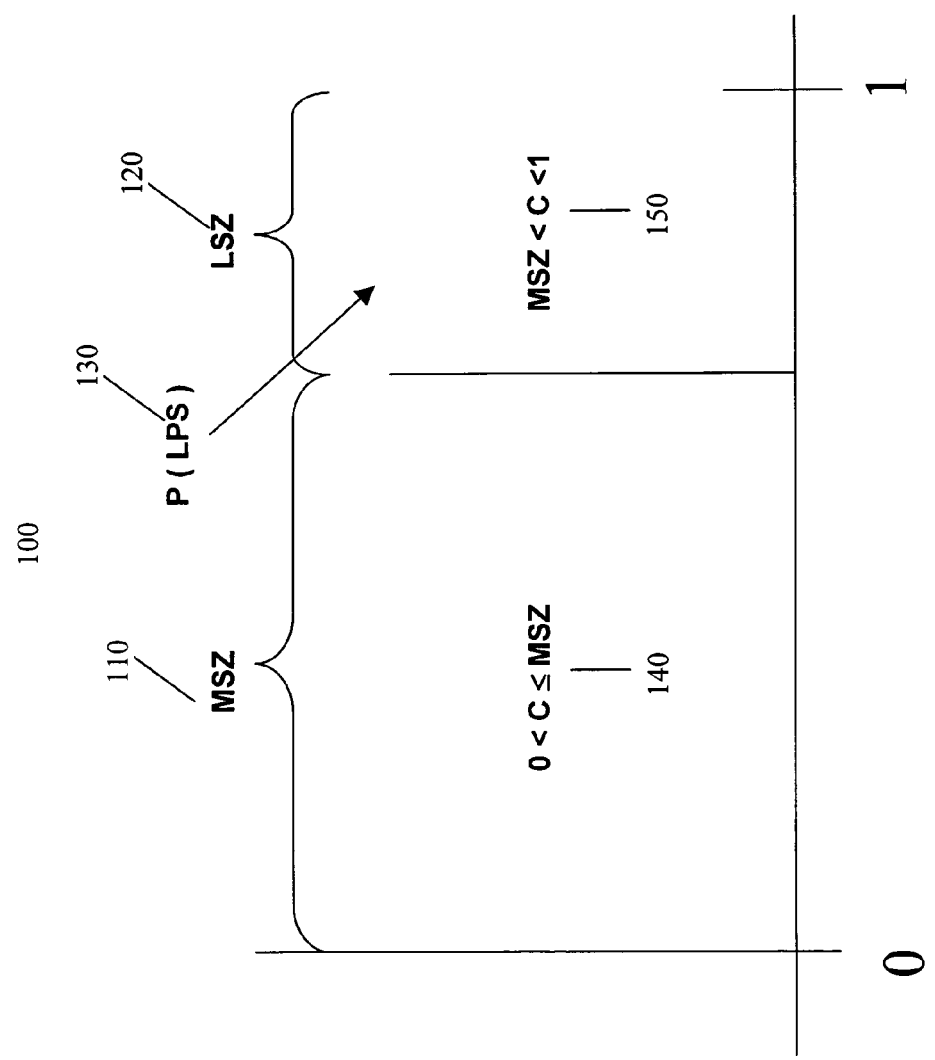
FIG. 1 illustrates determining the symbol to be used to decode one symbol.

Referring to FIG. 1, a symbol representing an element of a video data stream is to be decoded. Based on previously encoded symbols, a most probable symbol ("MPS") and a less probable symbol ("LPS") are identified as potential symbols to be used as a basis in the decoding process. Each symbol has a probability associated with it, based at least in part on the previously decoded symbols and the context models used to decode them. By definition, the MPS has a higher probability of being the appropriate symbol to represent the current symbol than the LPS. By normalizing the probabilities of each symbol, the MPS and LPS can be represented using subintervals of an interval between 0 and 1 (100). During each cycle of the decoding process, the decoder maintains values that correspond to the base of the interval and the interval size. The interval is subdivided into two subintervals, which are proportional in size to the relative probabilities of the MPS and the LPS. The MPS subinterval can be considered to be below (or before) the LPS subinterval, and is identified as MSZ (110). The LPS subinterval then includes the remainder of the interval, and is identified as LSZ (120). As a result, the boundary between the MSZ (110) and LSZ (120) is the normalized probability (130) that the MPS is the appropriate symbol to be used for decoding the current symbol.

As the code stream is received by the decoder, a code value is calculated and compared to the boundary line between the MPS and LPS subintervals (130). If the calculated value falls within the MSZ (110), the MPS is used to represent the current symbol. Alternatively, if the code value falls within the LSZ (120), the LPS is used to represent the current symbol. The interval is then updated based on the decoded symbol, using the MSZ interval if the MPS was used, LSZ interval if the LPS was used, and the process is repeated until the code stream is exhausted and all symbols are decoded. The context dependent information is then stored in an associated memory, and the code and interval registers are re-normalized in order to ensure precision is maintained.

Re-normalization is typically done when the interval size drops below ½. In this case, the code and interval registers are both multiplied by 2 repeatedly until the MSZ is once again in the ½ to 1 range.

The pseudo code below describes one possible representation of this process:

```
/* Definitions */
I = interval
C = Code register
LPS = less probable symbol
MPS = more probable symbol
LSZ = LPS sub interval of I
MSZ = MPS sub interval of I
    /* begin process */
    Initialize decoder
    While encoded symbols exist in stream
        Calculate LSZ based on conditional probabilities of LPS
        Set MSZ = I − LSZ
        If C < MSZ
            Decoded symbol is MPS
            Set I = MSZ
        Else
            Decoded symbol is LPS
            Set I = LSZ
        End If
        If I < 0.5
            Renormalize I and C
        End if
    End while
    /* end process */
```

Figure 2:
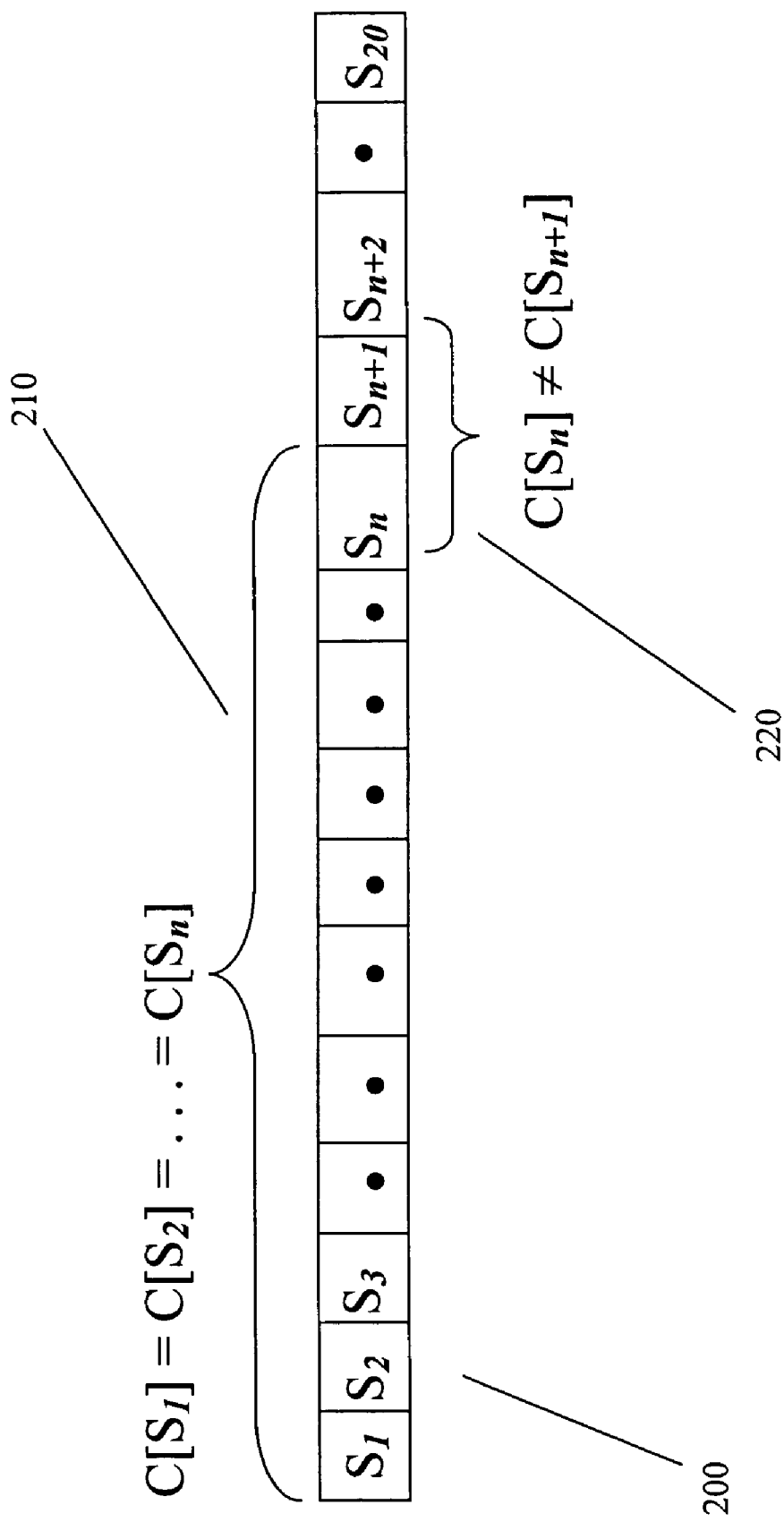
FIG. 2 illustrates a stream of encoded video data.
Figure 3:
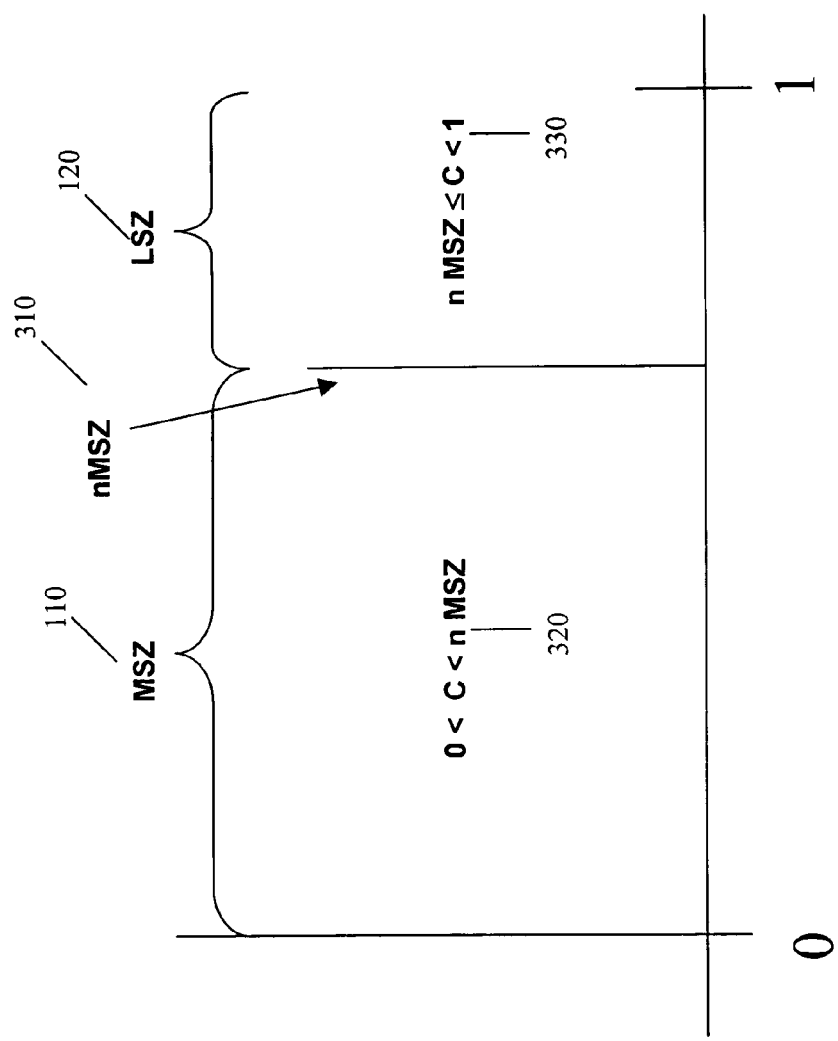
FIG. 3 illustrates determining the symbol to be used to contemporaneously encode a string of symbols in accordance with the invention.

FIGS. 2 and 3 illustrate one possible embodiment of the invention in which multiple symbols are decoded in parallel during one clock cycle of a decoding device such as an H.264 codec. Referring to FIG. 2, in one embodiment, the maximum number of symbols per cycle that need to be encoded to support the input requirements of the playback device may be 20 symbols per coding cycle. In such a case, a string of up to 20 encoded symbols 200 (denoted as $S_1, S_2, \ldots S_{20}$) that are to be decoded are fed into a decoder device, which determines the context (C) for a series of symbols 210 (denoted as $S_1, S_2, \ldots S_n$), which are a subset of the string 200. Initially, the subset of symbols includes the entire string of 20 symbols (i.e., n=N=20). If the context for each of the 20 symbols is not equal, n is reduced by one and the decoder determines if the contexts for the remaining 19 symbols are equal. This process continues until the series of symbols 210 is comprised of a set of n symbols where n≦20, each having the same coding context. By definition, the context of the next symbol in the string, $S_{n+1}$ is either different from the context of the previous symbol if n<20 as shown by the comparison 220, or the next symbol is not needed based on the maximum required output (i.e., it is the $21^{st}$ symbol). In other embodiments, other values for N can be used as the maximum output rate.

Once the series of symbols 210 having the same context is determined, the decoder determines if the symbols to be decoded are properly represented by a series of MPSs. The decoder determines the LSZ value for the current context based on the LPS for the series of symbols 210, and multiples the value by n, the number of symbols in the series 210 to obtain a boundary value 310 equal to I−(n*LSZ). If the code register value $C_1$ 320 10 falls below the boundary 310, then there is a string of MPSs that can all be output in the same cycle. In some embodiments, the decoder attempts to identify, in parallel, multiple values for N for which $C_1$ falls below the boundary 310. Once the decoder has determined the maximum value for N meeting the above criteria (max(N)), it produces a string of MPSs of length max(N).

The pseudo code below describes one possible representation of this process:

```
/* Definitions */
I = interval
C = Code register as determined from the coding contexts
LPS = less probable symbol
MPS = more probable symbol
LSZ = LPS sub interval of I
MSZ = MPS sub interval of I
N = Upper bound on number of symbols to encode
n = number of symbols in current series
    /* begin process */
    Initialize decoder
    While encoded symbols exist in stream
```

```
-continued

For all choices of n from highest to lowest
    If coding context is the same for the next n symbols
        nMSZ = I - ( n * LSZ)
        if(nMSZ >= 0.5)
            if C < nMSZ
                output n MPSs
                I = nMSZ
                Renormalize I and C
                goto next 'while' loop iteration
            end if
        end if
    end if
end
/* decode single symbol in usual (nonaccelerated) fashion */
if C < MSZ
    decoded symbol is MPS
    Set I = MSZ
Else
    Decoded symbol is LPS
    Set I = LSZ
End if
If I < 0.5
    Renormalize I and C
End if
End while
/* end process */
```

In some embodiments, the contexts for multiple symbols can be determined in parallel using separate hardware means. As the value of N increases, the encoding or decoding speed will increase and additional hardware is required to process the symbols. In other embodiments the step of determining the contexts can be implemented using software means.

The method used to determine the context of each symbol can differ depending on the coding standard being used by the encoder device. For example, in some embodiments the contexts are calculated from previously encoded (or decoded) symbols. The various methods of calculating contexts differ from coding standard to coding standard, and are well known throughout the industry.

By applying processing multiple symbols in parallel, many possible cases can be optimized for single cycle operation. As an illustration, when four comparisons are done in parallel, the invention allows the coding of 1, 2, 4, and 8 MPS runs each in a single cycle. In the case of H.264, it is desirable to have, for example, as many as 20 parallel comparisons to provide maximum decoding acceleration. In some embodiments, the encoder checks if the interval needs to be re-normalized during each cycle.

The discussions above describes applying a multi-bit technique when decoding. Similar concepts may be used when encoding a stream of video data. In one possible embodiment, a decoder looks ahead N bits (where N is the desired maximum run of MPSs to code simultaneously) to determine if each bit can all be represented by the MPS. Similar to the decoding example above, the encoder can simultaneously check for any number of MPS run lengths in parallel. Once the maximum length MPS run that does not require re-normalization is determined, then all of the MPS bits can be encoded in a single cycle. Many standard techniques can be applied in hardware to reduce logic and/or increase speed for determining the maximum length MPS run.

The methods described above may be implemented using one or more data processing devices. In some embodiments, the data processing devices may implement the functionality of the present invention in hardware, using, for example, a computer chip. The data processing device may receive signals in analog or digital form. In other embodiments, the data processing device may implement the functionality of the present invention as software on a general purpose computer, video display device, or other electronic device. In such an embodiment, the program may be written in any one of a number of programming languages, such as FORTRAN, PASCAL, C, C++, C#, Tcl, or BASIC. Further, the program can be written in a script, macro, or functionality embedded in commercially available software, such as EXCEL or VISUAL BASIC.

Additionally, the software could be implemented in an assembly language directed to a microprocessor resident on a video display device, computer or other electronic device. For example, the software can be implemented in Intel 80x86 assembly language if it is configured to run on an IBM PC or PC clone. The software may be embedded on an article of manufacture including, but not limited to, "machine-readable program means" such as a floppy disk, a hard disk, an optical disk, a magnetic tape, a PROM, an EPROM, ROM, or CD-ROM.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

What is claimed is:

1. A method of processing a stream of data, comprising:
   receiving a stream of data, the stream of data including a plurality of encoded symbols at a circuit;
   contemporaneously processing a first subset of the encoded symbols to identify a second subset of the encoded symbols, wherein each symbol in the second subset of the encoded symbols are encoded based on a common probability of occurrence of symbols in a symbol set, and wherein encoded symbols in the first subset that are not in the second subset are not encoded based on the common probability of occurrence of symbols in the symbol set;
   evaluating at least one symbol from the second subset of encoded symbols to determine the common probability of occurrence of symbols in the symbols set after contemporaneously processing the first subset; and
   using the common probability of occurrence of symbol in the symbol set to process the second subset of encoded symbols.

2. The method of claim 1 wherein processing the second subset of encoded symbols comprises decoding the stream of data.

3. The method of claim 1 wherein the data stream includes encoded video data.

4. The method of claim 3 wherein the encoded symbols represent elements of the encoded video data.

5. The method of claim 4 wherein the encoded symbols are encoded using the H.264 standard encoding scheme.

6. The method of claim 4 wherein the encoded symbols are encoded using the MPEG-4 part 10 standard encoding scheme.

7. A method of processing a stream of data, comprising:
   receiving a stream of data, the stream of data comprising a plurality of symbols to be encoded at a circuit;
   contemporaneously encoding a first subset of the symbols to identify a second subset of the symbols, where each symbol in the second subset uses a common encoding context, wherein said encoding context indicates a probability for a plurality of possible symbols;
   evaluating at least one symbol from the second subset of symbols to determine the common coding context; and using the common encoding context to encode the second subset of symbols; and wherein each symbol in the second subset of the encoded symbols are encoded based on a common probability of occurrence of symbols in a symbol set, and wherein encoded symbols in the first subset that are not in the second subset are not encoded based on the common probability of occurrence of symbols in the symbol set.

8. The method of claim 7 wherein the stream of data includes video data.

9. The method of claim 8 wherein the symbols represent elements of the video data.

10. The method of claim 9 wherein the video data is encoded using the H.264 standard encoding scheme.

11. The method of claim 9 wherein the video data is encoded using the MPEG-4 part 10 standard encoding scheme.

12. The method of claim 7, wherein the coding context indicates a most probable symbol.

13. The method of claim 12, further comprising:
determining a probability for the most likely symbol; and
determining a probability for the less likely symbol.

14. The method of claim 13, further comprising:
establishing a boundary value based on the probability for the most likely symbol and the less likely symbol.

15. The method of claim 14, further comprising:
calculating a code value from the stream of data; and
determining whether to select the most likely symbol or the less likely symbol based on a comparison of the code value with the boundary value.

16. The method of claim 7, wherein the coding context indicates a less probable symbol.

* * * * *